(12) United States Patent
Ispasoiu et al.

(10) Patent No.: US 7,009,173 B2
(45) Date of Patent: Mar. 7, 2006

(54) LENS MOUNT INTEGRATED WITH A THERMOELECTRICALLY COOLED PHOTODETECTOR MODULE

(75) Inventors: Radu Ispasoiu, Los Gatos, CA (US); Thomas R. Gockel, Modesto, CA (US); James S. Vickers, San Jose, CA (US)

(73) Assignee: Credence Systems Corporation, Milpitas, CA (US)

( * ) Notice: Subject to any disclaimer, the term of this patent is extended or adjusted under 35 U.S.C. 154(b) by 10 days.

(21) Appl. No.: 10/872,595

(22) Filed: Jun. 22, 2004

(65) Prior Publication Data

US 2005/0279923 A1    Dec. 22, 2005

(51) Int. Cl.
*H01J 40/14*    (2006.01)
*H01J 5/02*    (2006.01)

(52) U.S. Cl. ..................................... 250/239; 250/216
(58) Field of Classification Search ............... 250/216, 250/239
See application file for complete search history.

(56) References Cited

U.S. PATENT DOCUMENTS

| 4,039,826 | A | * | 8/1977 | Wingate ................. 250/237 G |
| 5,073,831 | A | | 12/1991 | Flint |
| 5,845,031 | A | * | 12/1998 | Aoki ........................... 385/92 |
| 6,109,039 | A | | 8/2000 | Hougham et al. |
| 6,125,635 | A | | 10/2000 | Nomura et al. |
| 6,469,844 | B1 | | 10/2002 | Iwase et al. |
| 6,477,844 | B1 | | 11/2002 | Ohkubo et al. |
| 6,621,275 | B1 | | 9/2003 | Cotton et al. |
| 6,720,588 | B1 | | 4/2004 | Vickers |
| 6,873,640 | B1 | * | 3/2005 | Bradburn et al. ........... 372/101 |

OTHER PUBLICATIONS

Vacuum Sealing Adds Life to Scientific CCDs, Hugh Cormican, Photonics Spectra, pp 69-70, Apr. 2004.

* cited by examiner

*Primary Examiner*—David Porta
*Assistant Examiner*—Patrick J. Lee
(74) *Attorney, Agent, or Firm*—Sughrue Mion, PLLC; Joseph Bach, Esq.

(57) ABSTRACT

An integrated housing for a lens and a photodetector, which is being cooled to low temperatures to enable the detector to detect faint emission of photons. An enclosure is provided to which a lens is affixed from one side using a retaining ring, and a photodetector is affixed from the opposite side. The enclosure is affixed to a TE cooler. The enclosure and the retaining ring are made from materials having similar thermal expansion coefficients.

20 Claims, 2 Drawing Sheets

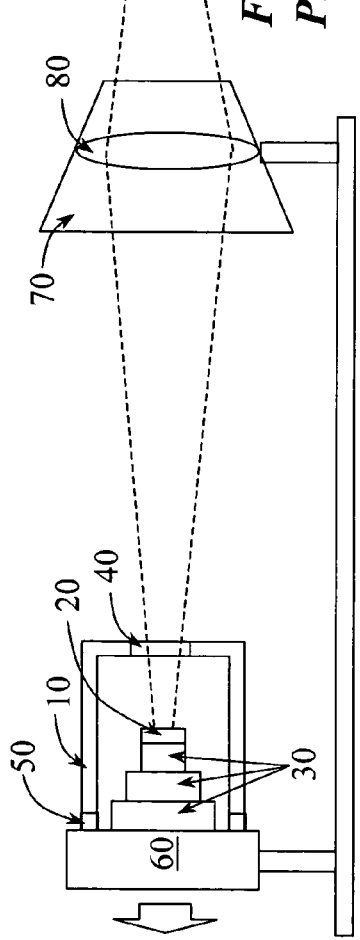
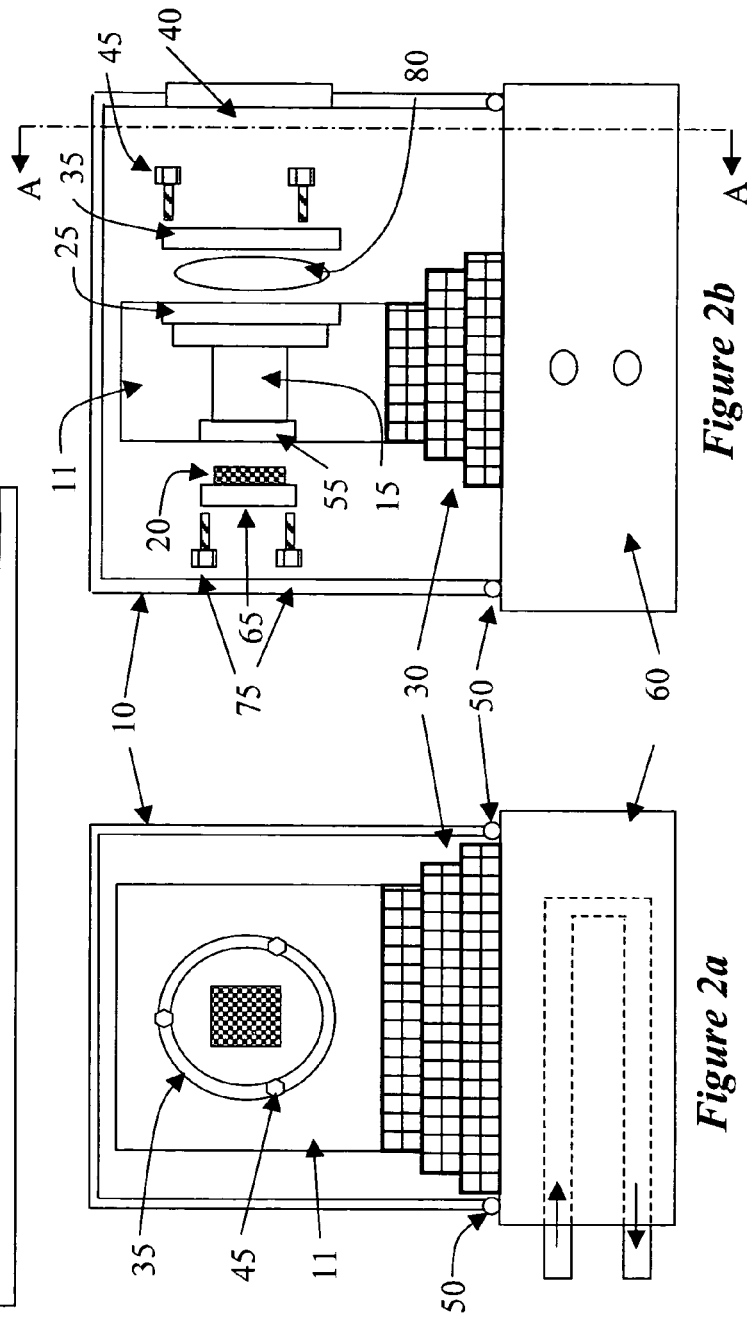

LENS MOUNT INTEGRATED WITH A THERMOELECTRICALLY COOLED PHOTODETECTOR MODULE

BACKGROUND OF THE INVENTION

1. Field of the Invention

The present invention relates to an apparatus and method for housing a lens and a photodetector, the photodetector being cooled to a desired temperature.

2. Description of the Related Art

Various photodetectors have been developed that are capable of detecting very faint light. Such detectors may be in the form of, for example, a photomultiplier tube (PMT), a photocathode coupled to a multichannel plate (MCP), an avalanche photodiode (APD), a charged couple device (CCD) etc. Notably, in applications where accurate detection of very faint light is required, such detectors need to be cooled to a specified temperature. An example of an APD used in cooled mode to detect light emission from semiconductor devices is described in U.S. Pat. No. 6,720,588, which is commonly assigned to the present assignee, and which is incorporated herein by reference in its entirety.

One application where detection of very faint light requires sensitive detectors that operate in a cool mode is for testers used for testing and debugging semiconductor circuits. One such system that utilizes an APD described in the above-cited patents is described in U.S. Pat. No. 6,621,275, commonly assigned to the current assignee and incorporated herein by reference in its entirety. Such a system is commercially available under the trademark EmiScope® from assignee, Optonics Inc., a Credence Company, of Mountain View, Calif. In this system the APD is required to be cooled to well below zero degrees Celsius.

While there are various methods for cooling semiconductor devices, such as photodetectors, one particularly useful method is using the Peltier effect. The Peltier effect and cooling apparatus and methods using the Peltier effect are described in, for example, U.S. Pat. Nos. 6,477,844; 6,125,635; and 6,109,039, which are incorporated herein by reference in their entirety.

Another problem described in the literature is protecting the detector from deterioration due to moisture, hydrocarbons and other gas contaminants. These effects cause the detector's performance to deteriorate over time. Therefore, various works have proposed enclosing the detector in a vacuum enclosure having a window through which photodetection can be performed. See, for example, Vacuum Sealing Adds Life to Scientific CCDs, Dr. Hugh Cormican, Photonics Spectra, April 2004.

FIG. 1 depicts an arrangement of a conventional housing for a cooled photodetector. In the arrangement of FIG. 1, the cover 10 is affixed to a base 60 via sealing mechanism 50. The cover includes a window 40 that is aligned with photodetector 20. The photodetector 20 is held against a thermo-electrical cooler (TE cooler) 30, which, in this case, is shown to comprise of three stages of Peltier effect layers. The TE cooler 30 collects heat from the detector 20 and transfers the heat to the base 60, which is also used as a heat sink. The heat from the base 60 is then removed, as illustrated by the large arrow. The enclosure is evacuated and may be filled with inactive gas, such as argon. This entire arrangement is then aligned with the lens holder 70, which houses lens 80.

One drawback of prior art (as is clear from FIG. 1) is the fact that the focusing lens is constrained to be far from the active area of the photodetector, because of the necessary window in between. For that reason, it is very hard to achieve small enough light spot sizes with available aspheric lenses, when the lens working distance must be longer than 6 mm (at best). Another drawback described in the literature is that the window may collect moisture and degrade the detection efficiency. Also, any coating, such as antireflective coating provided on the window may also degrade with time. Accordingly, a better solution is needed that would enable both cooling and protecting the light sensor, provide a small light spot on the detector, and, at the same time, avoid the drawbacks of the prior art.

SUMMARY OF THE INVENTION

The present invention provides novel apparatus and method for housing a photodetector requiring cooling to a specified temperature. The inventive apparatus and method enables higher efficiency of photon collection, while avoiding the problems associated with prior art window-based approach. The invention makes possible the focusing of the incident light within small detector active areas (e.g., less than 100 $\mu$m diameter), which is a critical factor in achieving fast detection of short pulses of photons.

In one aspect of the invention, a novel integrated housing is constructed, which houses the lens and the detector, and is affixed to the TE coolers, all of which is inside an enclosure.

In one aspect of the invention an enclosure is provided inside which a housing is contained. The lens is affixed to one side of the housing using a retaining ring, and a photodetector is affixed to the opposite side. The housing is affixed to a TE cooler.

In one aspect of the invention an enclosure is provided inside which a housing is contained. The lens is affixed to one side of the housing using a retaining ring, and a photodetector is affixed to the opposite side. The housing is affixed to a TE cooler. The housing and the retaining ring are made from materials having similar thermal expansion coefficients. In one example, the housing and the retaining ring are made of copper or brass.

BRIEF DESCRIPTION OF THE DRAWINGS

FIG. 1 depicts a prior art photodetector housing.

FIG. 2a is a front cross-section of an embodiment of the present invention, done along line A—A in FIG. 2b, while FIG. 2b is a side elevation of the embodiment of FIG. 2a.

DETAILED DESCRIPTION

Figure 4:
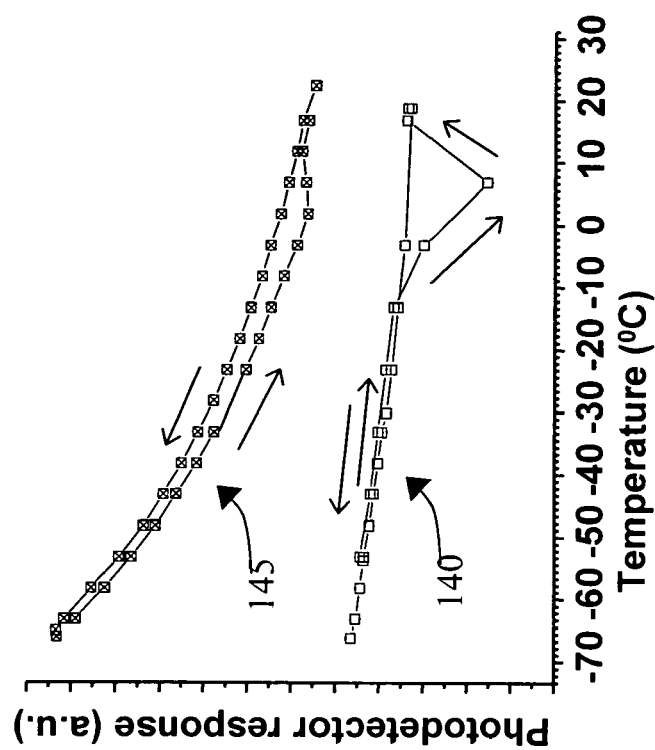
FIG. 4 is a plot of data collected for two test fixtures and demonstrating the improvement provided by the inventive arrangement.

The present invention provides an integrated housing for a lens and a photodetector, which is being cooled to low temperatures to enable the detector to detect faint emission of photons. One embodiment of the invention is depicted in FIGS. 2a and 2b, FIG. 2a being a front view, while FIG. 2b being a side "exploded" view. In this embodiment, the housing is made to accommodate both the detector and the lens. In this way, an integrated solution is provided which eliminates the need for, and the problems associated with conventional window housing. The integrated housing is provided with a TE cooler, so that both the photodetector and the lens are being cooled. In this embodiment, the lens can be placed as close to the photodetector as desired, as it is placed beyond the window. This enables obtaining as small a spot on the detector as desired using conventional lenses.

In FIGS. 2a and 2b, a housing 11 is made of a thermally conductive material, such as, for example, copper or brass. In this particular example, the housing 11 is made out of a solid block, with the appropriate machining made as depicted and explained below. Specifically, a bore 15 is drilled through the block to allow light to pass from the front to the backside. In the front side, a chamfer 25 is machined to accommodate retaining ring 35. When the retaining ring 35 is secured to the housing 11 using the bolts 45, it holds lens 80 in alignment with bore 15. In this embodiment, the lens is a focusing lens, which focuses the light onto photodetector 20. Notably, the housing 11 may be machined so as to place the lens in any depth desired, i.e., as close to photodetector 20 as desired.

Another chamfer 55 is machined on the backside of the housing 11, to accommodate holder 65. When the holder 65 is secured to the housing 11 using bolts 75, the photodetector 20 is placed in alignment with the lens 80. Optionally, the holder 65 and the retaining ring 35 form a sealed contact with the housing, so that bore 15 is sealed from the environment and may be evacuated and/or filled with inert gas. The housing 11 is affixed to a TE cooler 30, in this embodiment using three Peltier effect layers. The TE cooler is affixed to a heat sink 60, having cooling fluid channels therein for circulating cooling fluid as illustrated by the intake and exhaust arrows in FIG. 2a. In this particular embodiment, the TE cooler enables temperature reduction by up to 90 degrees, thereby enabling the photodetector to operate at well below zero degrees Celsius. The entire arrangement is then enclosed by cover 10, which is seallably affixed to base 60 via sealing mechanism 50, such as an o-ring.

Figure 3:
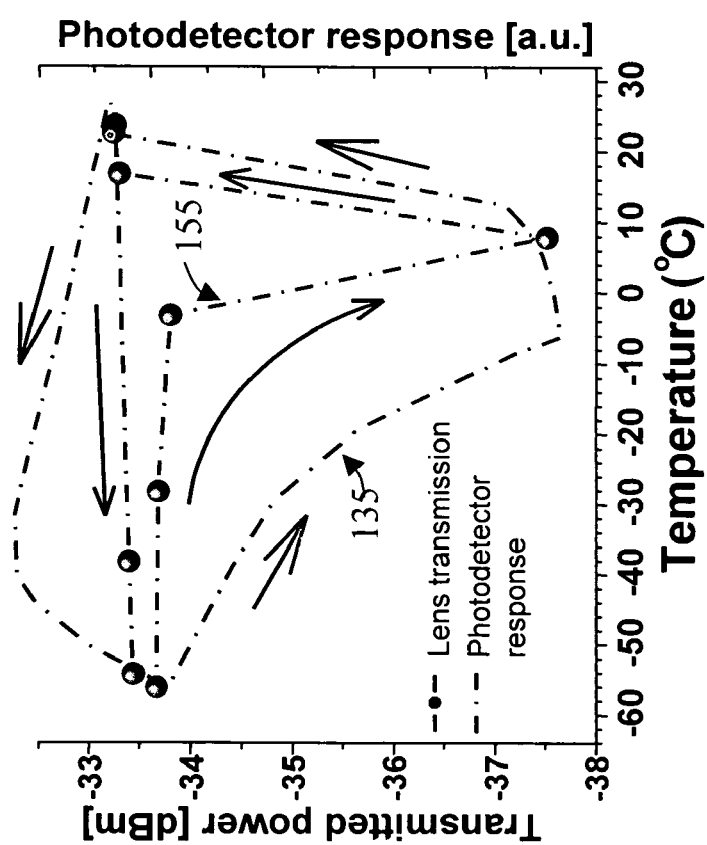
FIG. 3 is a plot showing hysterisis effects exhibited by the commercially available lens.

However, during the testing of various embodiments of the integrated housing, it was discovered that the optical throughput of various commercially available lens assemblies exhibited a hysteresis when undergoing temperature cycling. Moreover, it was observed that the lens behavior affects the performance of the combined lens-photodetector arrangement. This is shown in FIG. 3, wherein plot 155 depicts the lens transmission vs. temperature, while plot 135 depicts the behavior of the detector vs. temperature, for the original arrangement. (The units for the transmission variation are –dBm, so the higher the number, the lower the transmission.) Notably, during the necessary cooling the lens transmission degrades by 0.5 dB, while during the warm up a hysteresis behavior is exhibited, as transmission power falls dramatically by 4 dB when the temperature approaches 0° C. As also shown by the plot, this behavior affects the photodetector response as well. While during cooling the photodetector response improves as the temperature is reduced, at about –40° C. the response suddenly degrades and then further deteriorates as the temperature is increased. Such behavior is detrimental to the usability of the arrangement, as one would have to always wait until thermomechanical stabilization is achieved.

In FIG. 3, the temperature cycling plots for both the lens transmission and the photodetector response are measured for the case of fast temperature cycling. It was discovered that the lens behaves the worst when the cooling is fast—indicating that the mechanical strain on the lens due to fast thermal stresses is strong. It took 24 hours for the transmission to recover after the fast cooling of the detector, indicating that the transmission drop was not a permanent damage, but of a thermal stress nature. Further tests showed that when slow cooling cycle was used the lens assembly transmission hysterisis became less dramatic.

As a result of these investigations, it was determined that in order to reduce the hysterisis effect the parts making up the assembly should be made of components having small variation of thermal expansion coefficient, e.g., copper, brass, and glass. Therefore, it was concluded that the ring 35 holding the lens should be made of a material having similar thermal coefficient as that of the housing 11. Additionally, while in the original assembly epoxy was used to retain the lens in place, it was determined that the lens should be mechanically retained by having ring 35 bolted onto housing 11, rather than held with an epoxy.

To test these conclusions, two sets of assemblies were constructed and tested. One assembly included a ring 35 made of material having thermal coefficient that differs from that of housing 11, and that was held in place using epoxy. A second assembly was constructed according to the embodiment shown in FIG. 2, wherein the ring 35 was made of the same material as housing 11, and was held in place by bolts 45 and no epoxy. To provide an extreme example, the first assembly was tested using a slow cycle—where the hysterisis effect is expected to be the mildest. The second assembly was tested using a fast cycle, where the hysterisis effect is expected to be the most dramatic.

The results of these tests are shown in FIG. 4. Plot 140 shows the results of the first assembly, wherein hysteresis is still exhibited. On the other hand, plot 145 shows the results for the assembly constructed according to FIGS. 2a and 2b. As can be seen, no hysteresis is exhibited, even though fast cycle was used. Moreover, the total response to cooling is improved, as can be seen from the improved slope with cooling.

While the invention has been described with reference to particular embodiments thereof, it is not limited to those embodiments. Specifically, various variations and modifications may be implemented by those of ordinary skill in the art without departing from the invention's spirit and scope, as defined by the appended claims. Additionally, all of the above-cited prior art references are incorporated herein by reference.

What is claimed is:

1. An integrated detector and lens assembly, comprising:
   a housing made of a block of a first material having a defined thermal expansion coefficient, said housing having a front side and a back side opposite said front side;
   a first provision said back side of the housing enabling affixing of a photodetector on said housing;
   a second provision on said front side of the housing, opposing the first provision, enabling affixing of an optical lens therein;
   a retaining ring made of a second material having a thermal expansion coefficient similar to that of the housing, said retaining ring being attachable to the housing to thereby secure the lens in said second provision.

2. The assembly of claim 1, wherein said first and second materials are one of copper and brass.

3. The assembly of claim 1, wherein the lens is a focusing lens.

4. The assembly of claim 2, wherein the lens is a focusing lens.

5. The assembly of claim 1, wherein the retaining ring is affixed to the housing using bolts.

6. The assembly of claim 2, wherein the retaining ring is affixed to the housing using bolts.

7. The assembly of claim 1, wherein the housing is affixed to a thermo-electric cooler.

8. The assembly of claim 2, wherein the housing is affixed to a thermo-electric cooler.

9. The assembly of claim 5, wherein the housing is affixed to a thermo-electric cooler.

10. An integrated detector and lens assembly, comprising:
    a housing made of a solid block of a first material having a defined thermal expansion coefficient, said solid block having a bore provided therethrough;
    a first provision on one side of the bore enabling affixing of a photodetector therein;
    a second provision on a second side of the bore, opposing the first provision, enabling affixing of an optical lens therein;
    a lens holder made of a second material having a thermal expansion coefficient similar to that of the housing, said lens holder being attachable to the housing to thereby secure the lens in said second provision.

11. The assembly of claim 10, wherein said first and second materials are one of copper and brass.

12. The assembly of claim 10, wherein the lens is a focusing lens.

13. The assembly of claim 12, wherein the lens is a focusing lens.

14. The assembly of claim 10, wherein the lens holder is affixed to the housing using bolts.

15. The assembly of claim 12, wherein the lens holder is affixed to the housing using bolts.

16. The assembly of claim 10, wherein the housing is affixed to a thermo-electric cooler.

17. The assembly of claim 12, wherein the housing is affixed to a thermo-electric cooler.

18. The assembly of claim 15, wherein the housing is affixed to a thermo-electric cooler.

19. A method for housing a photodetector and a lens, while enabling cooling to a low temperature, comprising:
    drilling a bore through a block of a first material having a defined thermal expansion coefficient, to thereby provide a housing;
    making a first provision on one side of the bore to enable affixing the photodetector to the housing;
    making a second provision on the second side of the bore to enable affixing the lens to the housing;
    making a lens retaining ring of a material having a thermal coefficient of expansion similar to that of the first material, and using the retaining ring to affix the lens to the housing.

20. The method of claim 19, further comprising affixing the housing to the thermo-electrical cooler.

* * * * *